United States Patent

Hudson et al.

[11] Patent Number: 6,057,602
[45] Date of Patent: May 2, 2000

[54] LOW FRICTION POLISH-STOP STRATUM FOR ENDPOINTING CHEMICAL-MECHANICAL PLANARIZATION PROCESSING OF SEMICONDUCTOR WAFERS

[75] Inventors: Guy F. Hudson; Russell C. Zahorik, both of Boise, Id.

[73] Assignee: Micron Technology, Inc., Boise, Id.

[21] Appl. No.: 09/134,279

[22] Filed: Aug. 14, 1998

Related U.S. Application Data

[62] Division of application No. 08/608,186, Feb. 28, 1996, Pat. No. 5,798,302.

[51] Int. Cl.$^7$ .................................................. H01L 23/48
[52] U.S. Cl. ........................... 257/752; 216/38; 216/53
[58] Field of Search ........................... 216/38, 52, 53, 216/81, 88, 89, 95; 438/690–693; 257/752, 758

[56] References Cited

U.S. PATENT DOCUMENTS

| | | | |
|---|---|---|---|
| 4,950,331 | 8/1990 | Pokhodnya et al. | 106/313 |
| 5,246,884 | 9/1993 | Jaso et al. | 437/225 |
| 5,262,346 | 11/1993 | Bindal et al. | 437/62 |
| 5,272,117 | 12/1993 | Roth et al. | 437/228 |
| 5,356,513 | 10/1994 | Burke et al. | 156/636 |
| 5,445,996 | 8/1995 | Kodera et al. | 437/225 |
| 5,559,367 | 9/1996 | Cohen et al. | 257/77 |
| 5,603,654 | 2/1997 | Hayashi | 451/36 |
| 5,629,242 | 5/1997 | Nagashima et al. | 438/692 |
| 5,646,053 | 7/1997 | Schepis et al. | 437/10 |

OTHER PUBLICATIONS

Bennett, H., "*Concise Chemical and Technical Dictionary,*" pp. 42–43 (1974).

Lide, David R., "*CRC Handbook of Chemistry and Physics,*" pp. 4–37 to 4–38 (1996–97).

*Primary Examiner*—Richard Bueker
*Assistant Examiner*—Alva C Powell
*Attorney, Agent, or Firm*—Dorsey & Whitney LLP

[57] ABSTRACT

The present invention is a semiconductor wafer that enhances polish-stop endpointing in chemical-mechanical planarization processes. The semiconductor wafer has a substrate with a device feature formed on the substrate, a stratum of low friction material positioned over the substrate, and an upper layer deposited on the low friction material stratum. The low friction stratum has a polish-stop surface positioned at a level substantially proximate to a desired endpoint of the chemical-mechanical planarization process. The upper layer, which is made from either a conductive material or an insulative material, has a higher polishing rate than that of the low friction stratum. In operation, the low friction stratum resists chemical-mechanical planarization with either hard or soft polishing pads to stop the planarization process at the desired endpoint.

21 Claims, 4 Drawing Sheets

LOW FRICTION POLISH-STOP STRATUM FOR ENDPOINTING CHEMICAL-MECHANICAL PLANARIZATION PROCESSING OF SEMICONDUCTOR WAFERS

CROSS-REFERENCE TO RELATED APPLICATION

This application is a divisional of U.S. patent application Ser. No. 08/608,186, filed Feb. 28, 1996.

TECHNICAL FIELD

The present invention relates to chemical-mechanical planarization of semiconductor wafers; more specifically, the present invention relates to a polish-stop layer for effectively endpointing chemical-mechanical planarization processes that use either hard or soft polishing pads.

BACKGROUND OF THE INVENTION

Chemical-mechanical planarization ("CMP") processes remove material from the surface of a wafer in the production of ultra-high density integrated circuits. In a typical CMP process, a wafer is pressed against a polishing pad in the presence of a slurry under controlled chemical, pressure, velocity, and temperature conditions. The slurry solution generally contains small, abrasive particles that abrade the surface of the wafer, and chemicals that etch and/or oxidize the surface of the wafer. The polishing pad is generally a planar pad made from a relatively porous material such as blown polyurethane. Thus, when the pad and/or the wafer moves with respect to the other, material is removed from the surface of the wafer by the abrasive particles (mechanical removal) and by the chemicals in the slurry (chemical removal).

FIG. 1 schematically illustrates a conventional CMP machine 10 with a platen 20, a wafer carrier 30, a polishing pad 40, and a slurry 44 on the polishing pad 40. The platen 20 has a surface 22 upon which the polishing pad 40 is positioned. A drive assembly 26 rotates the platen 20 as indicated by arrow A and/or reciprocates the platen back and forth as indicated by arrow B. The motion of the platen 20 is imparted to the pad 40 because the polishing pad 40 frictionally engages the upper surface 22 of the platen 20. The wafer carrier 30 has a lower surface 32 to which a wafer 50 may be attached, or the wafer 50 may be attached to a resilient pad 34 positioned between the wafer 50 and the lower surface 32. The wafer carrier 30 may be a weighted, free-floating wafer carrier, or an actuator assembly 36 may be attached to the wafer carrier 30 to impart axial and rotational motion, as indicated by arrows C and D, respectively.

In the operation of the conventional planarizer 10, the wafer 50 is positioned face-downward against the polishing pad 40, and then the platen 20 and the wafer carrier 30 move relative to one another. As the face of the wafer 50 moves across the planarizing surface 42 of the polishing pad 40, the polishing pad 40 and the slurry 44 remove material from the wafer 50.

CMP processes must consistently and accurately produce a uniform, planar surface on the wafer because it is important to accurately focus circuit patterns on the wafer. As the density of integrated circuits increases, current lithographic techniques must accurately focus the critical dimensions of photo-patterns to within a tolerance of approximately 0.35–0.5 $\mu$m. Focusing the photo-patterns to such small tolerances, however, is very difficult when the distance between the emission source and the surface of the wafer varies because the surface of the wafer is not uniformly planar. In fact, when the surface of the wafer is not uniformly planar, several devices on the wafer may be defective. Thus, CMP processes must create a highly uniform, planar surface.

In the competitive semiconductor industry, it is also highly desirable to maximize the throughput of CMP processes to produce accurate, planar surfaces as quickly as possible. The throughput of CMP processes is a function of several factors, two of which are the ability to accurately stop the CMP process at a desired endpoint and the rate at which material is removed from the wafer (the "polishing rate"). Accurately stopping the CMP process at a desired endpoint is important to maintaining a high throughput because the thickness of the dielectric layer must be within an acceptable range; if the thickness of the dielectric layer is not within an acceptable range, the wafer must be re-planarized until it reaches the desired endpoint. Maintaining a high, consistent polishing rate is also important to sustaining a high throughput because the polishing rate determines the length of the planarization process. Thus, it is desirable to stop the CMP process at the desired endpoint and to maintain a high polishing rate.

FIGS. 2A and 2B illustrate existing techniques to endpoint CMP processing using polish-stop layers. Referring to FIG. 2A, a stop-on-feature wafer 50($a$) has a substrate 60 and a number of device features 62 formed on the substrate 60. A polish-stop layer 80 is deposited over the substrate 60 and the device features 62, and an insulative layer 70 is deposited on the polish-stop layer 80. The polish-stop layer 80 has a lower polishing rate than that of the insulative layer 70. Referring to FIG. 2(B), an interconnect wafer 50($b$) has a substrate 60, a device feature 62 formed in the substrate 60, an insulative layer 70 deposited over the substrate 60, and a polish-stop layer 80 deposited on the insulative layer 70. A via 74 is cut through the insulative layer 70 and the polish-stop layer 80, and a conductive layer 90 is deposited into the via 74 and over the polish-stop layer 80. The portion of the conductive layer 90 in the via 74 forms an interconnect 92 to the device feature 62. In case of an interconnect wafer, the polish-stop layer 80 also has a lower polishing rate than that of the conductive layer 90.

In operation, the insulative layer 70 of the stop-on-feature wafer 50($a$) or the conductive layer 90 of the interconnect wafer 50($b$) is planarized until the polishing pad (shown in FIG. 1) engages the top surface 81 of the polish-stop layer 80. Since the polishing rate of the polish-stop layer 80 is lower than that of the upper layer, the polish-stop layer resists planarization under certain operating parameters to reduce the polishing rate at a desired endpoint.

U.S. Pat. No. 5,246,884 to Jaso et al. discloses using diamond or diamond-like carbon ("DLC") as a chemical-mechanical polish stop. In particular, a metallized semiconductor chip is coated with a first layer of silicon dioxide followed by a second layer of diamond or DLC as an etch stop. The DLC is deposited at about 75° C. to about 350° C. to form a layer of DLC with a thickness of 750 Å to 1000 Å. U.S. Pat. No. 5,246,884 discloses that DLC effectively stops planarization with softer polishing pads, such as an IC-40 or an IC-60 polishing pad, but that no difference in the thickness uniformity or planarity was observed when harder polishing pads were used to planarize wafers. U.S. Pat. No. 5,246,884 discloses that diamond or DLC works well as an etch stop with soft polishing pads because these substances are exceptionally hard.

One problem with DLC polish-stop layers is that they do not effectively endpoint CMP processing with hard polishing pads. Hard polishing pads are often the pad of choice for many CMP applications; compared to softer polishing pads, hard polishing pads reduce dishing over large features, withstand higher down forces, and resist wear better. Hard polishing pads, however, effectively planarize DLC because the carbon atoms are bonded to each other and to adjacent hydrogen atoms in a manner that prevents the carbon atoms from moving with respect to each other along substantially parallel, horizontal planes. Thus, because hard pads effectively planarize DLC, it would be desirable to make polish-stop layer from a material that effectively endpoints CMP processing with hard polishing pads.

Another problem with DLC polish-stop layers is that they are relatively time consuming to deposit on and remove from the wafers. Polish-stop layers made from DLC are deposited to a thickness of approximately 750 Å to approximately 1000 Å. As with any material, the process time to deposit a layer of DLC increases with increasing layer thickness. Moreover, in the case of interconnect wafers, the DLC layer is also cleaned from the surface of the wafer after the CMP process is finished to accommodate subsequent processing of the wafer. Thus, since the time to deposit and clean material increases with increasing layer thickness, it is desirable to reduce the thickness of the polish-stop layer without significantly impairing its effectiveness.

SUMMARY OF THE INVENTION

The inventive semiconductor wafer enhances polish-stop endpointing in chemical-mechanical planarization processes with both hard and soft polishing pads. The semiconductor wafer has a substrate with a device feature formed on the substrate, a stratum of low friction material positioned over the substrate, and an upper layer deposited on the low friction stratum. The low friction stratum has a polish-stop surface positioned at a level substantially proximate to a desired endpoint of the chemical-mechanical planarization process. The upper layer, which is made from either a conductive material or an insulative material, has a higher polishing rate than that of the low friction stratum. In operation, the low friction stratum resists planarization because it induces the polishing pad to slide over the wafer without removing material. Thus, the low friction stratum resists chemical-mechanical planarization with either hard or soft polishing pads to stop the planarization process at the desired endpoint.

In an inventive method for chemical-mechanical planarization, a stratum of low friction material is deposited over a semiconductor substrate to form a polish-stop surface of low friction material at a level substantially proximate to a desired endpoint of the planarization process. The low friction stratum is covered with an upper layer of material having a polishing rate higher than that of the low friction stratum. After the upper layer of material is deposited, the substrate is mounted to a wafer carrier of a chemical-mechanical planarization machine, and the upper layer is pressed against a polishing pad in the presence of a slurry. The polishing pad may be either a hard or a soft polishing pad. At least one of the wafer carrier or the polishing pad is moved with respect to the other to impart relative motion between the wafer and the polishing pad. In operation, the low friction stratum resists chemical-mechanical planarization with the polishing pad and the slurry to substantially stop the planarization process at the desired endpoint.

DETAILED DESCRIPTION OF THE INVENTION

The present invention is a semiconductor wafer, and a method for making the semiconductor wafer, that effectively resists planarization using hard polishing pads, high down forces, and aggressive slurries An important aspect of the invention is the discovery that a thin stratum of a low friction material substantially resists planarization by both hard and soft polishing pads. One suitable low friction material is graphitic carbon, which acts as a bearing between the polishing pad and the wafer because the carbon atoms bond to only a portion of the adjacent carbon atoms in a manner that allows adjacent, parallel layers of carbon atoms to slide over one another. Therefore, a graphitic carbon stratum with a polish-stop surface positioned proximate to a desired planarization endpoint effectively stops the planarization process at the desired endpoint with both hard and soft polishing pads. FIGS. 3–5D, in which like reference numbers refer to like parts, illustrate a semiconductor wafer and a method for making the semiconductor wafer in accordance with the invention.

Figure 3:
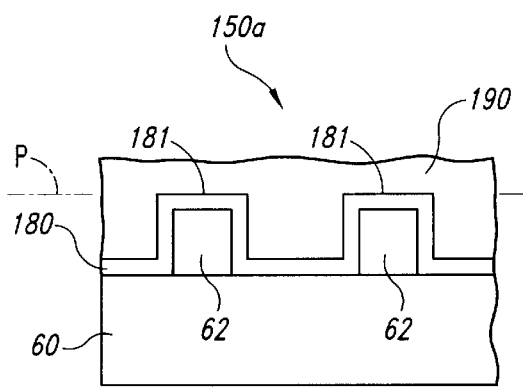
FIG. 3 is a partial schematic cross-sectional view of a wafer in accordance with the invention.

FIG. 3 illustrates a stop-on-feature semiconductor wafer 150(a) in accordance with the invention. The stop-on-feature wafer 150(a) has a substrate 60 and a number of device features 62 on the substrate 60. The substrate 60 is typically made from silicon, and the device features 62 may be conductive lines, switches, interconnects, or memory cells. The present invention, however, is not limited to any specific substrate materials or types of device features. A relatively thin stratum 180 of low friction material is deposited over the substrate 60 to form polish-stop surfaces 181 over the device features 62 e low friction material is preferably graphitic carbon because it is a low friction substance. The invention, however, is not limited to forming the low friction stratum 180 from graphitic carbon, as other low friction materials may be used. The low friction stratum 180 is deposited over the substrate 60 and the device features 62 at a temperature of between approximately 20° C. and approximately 500° C. preferably by plasma vapor deposition from a carbon target. The thickness of the low friction stratum 180 is between approximately 100 Å and approximately 1,000 Å, and preferably between 100 Å and 500 Å. The stop-on-feature surfaces 181 are positioned in a plain P that defines the desired endpoint of the CMP process. An upper layer 190 of insulated material is deposited on the low friction stratum 180. The upper layer 190 may be made from several insulated materials including, but not limited to, silicon dioxide, silicon nitride, borophosphate silicon glass, and other suitable substantially dielectric materials. Importantly, the low friction stratum 180 has a significantly lower polishing rate than that of the insulative material of the upper layer 190 because it induces the polishing pad to slide over the wafer without removing material.

Figure 4:
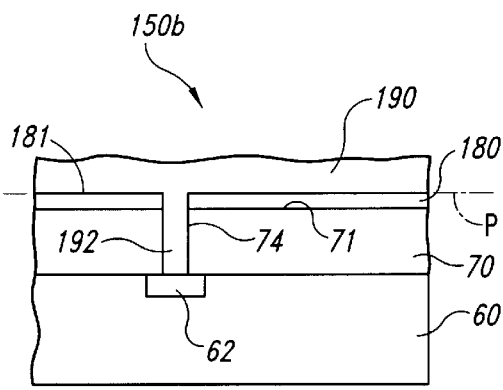
FIG. 4 is a partial schematic cross-sectional view of another wafer in accordance with the invention.

FIG. 4 illustrates an interconnect semiconductor wafer 150(b) in accordance with the invention. The interconnect wafer 150(b) has a substrate 60 and a device feature 62 formed in the substrate 60. An insulative layer 70 is formed on the substrate 60, and a low friction stratum 180 is deposited on the insulative layer 70. The upper surface of the low friction stratum 180 forms a polish-stop surface 181 over the insulative layer 70. As with the stop-on-feature wafer 150(a) shown in FIG. 3, the thickness of the low friction stratum 180 on the interconnect wafer 150(b) is between approximately 100 Å and approximately 1,000 Å, and preferably between approximately 100 Å and approximately 500 Å. A via 74 is formed through the insulative layer 70 and the low friction stratum 180, and an upper layer 190 is deposited on the low friction stratum 180. In this embodiment, the upper layer 190 is made from a conductive material to form an interconnect 192 coupled to the device feature 62. Suitable conductive materials from which the upper layer 190 may be made include tungsten, aluminum, and polysilicon. The low friction stratum 180 also has a significantly lower polishing rate than that of the conductive material of the upper layer of 190.

Figure 1:
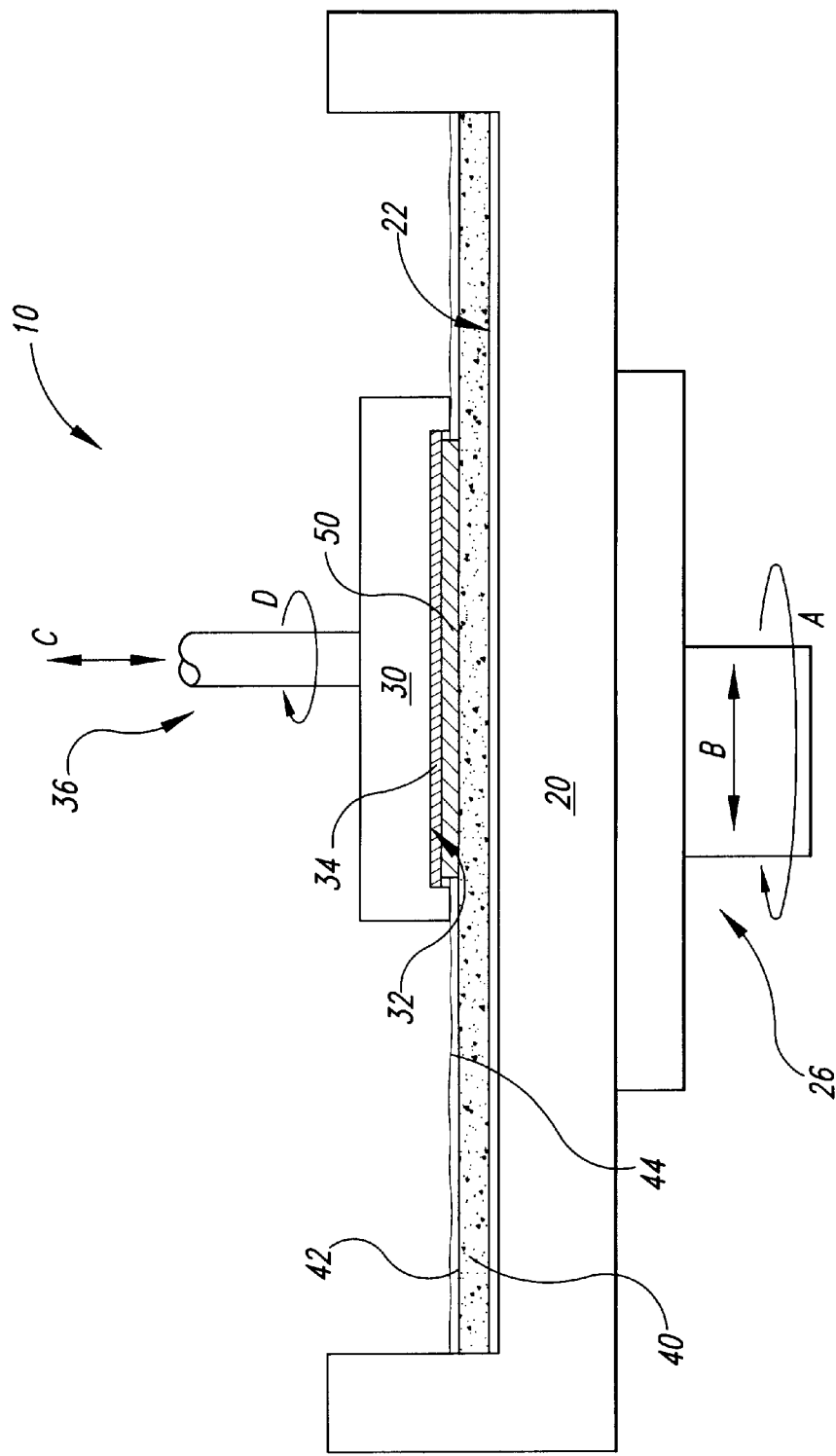
FIG. 1 is a schematic cross-sectional view of a planarizing machine in accordance with the prior art.
Figure 2A:
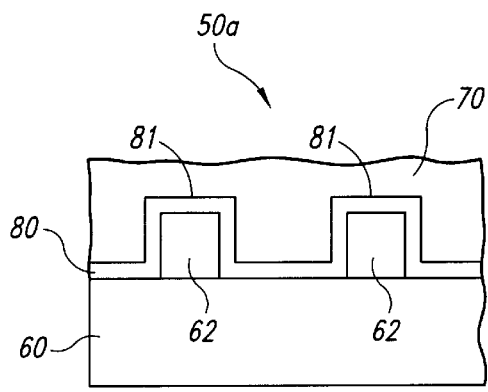
FIG. 2A is a partial schematic cross-sectional view of a wafer in accordance with the prior art.
Figure 2B:
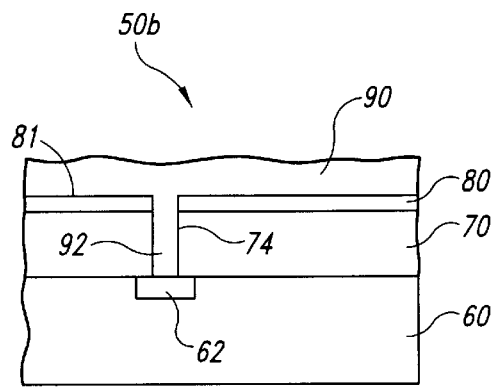
FIG. 2B is a partial schematic cross-sectional view of another wafer in accordance with the prior art.

In operation, the upper layer 190 of either the stop-on-feature wafer 150(a) or the interconnect wafer 150(b) is planarized in a CMP machine 10, as described above with respect to FIG. 1. A polishing pad (not shown) removes the upper layer 190 until the polishing pad engages the polish-stop surface 181 of the low friction stratum 180. Since the low friction stratum 180 has an extremely low polishing rate, it substantially prevents further planarization beyond the polish-stop surface 181. Therefore, the low friction stratum 180 effectively prevents further planarization beyond the desired endpoint of the CMP process.

One advantage of the present invention is that a low friction stratum 180 made from graphitic carbon has a very low polishing rate even when hard polishing pads, aggressive slurries, and high down forces are used in the CMP process. For example, after being planarized for approximately 60 second with a Rodel IC-1000 polishing pad and a Rodel ILD 1300 slurry (manufactured by Rodel Corporation of Newark, Del.), graphitic carbon stratums with a thickness of approximately 300 Å to 500 Å experienced a film loss of only approximately 0.99% to 2.17%. Similarly, after being planarized for 60 seconds with a Rodel Politex polishing pad and a Rodel MSW 2000 slurry, graphitic carbon stratums with thicknesses of approximately 300 Å to 500 Å experienced a film loss of approximately 1% to 8.4%. The Rodel IC-1000 polishing pad is a hard polishing pad and the Rodel MSW 2000 slurry is an aggressive slurry with aluminum dioxide particles. Conversely, the Rodel Politex polishing pad is a soft pad and the Rodel ILD 1300 slurry is a non-aggressive slurry. As shown by the results of the tests, graphitic carbon effectively stops planarization with hard polishing pads, soft polishing pads, aggressive slurries, and non-aggressive slurries. Therefore, even when hard polishing pads are used, a low friction stratum 180 made from graphitic carbon stops the CMP process at a desired endpoint.

Compared to typical DLC polish-stop layers, the graphitic carbon stratum of the present invention has a much lower polishing rate with hard polishing pads. The graphitic carbon stratum of the invention is essentially free of carbon-hydrogen bonds and has an SP-3 lattice structure to allow the layers of carbon atoms in the stratum to slide with respect to each other. Conversely, DLC has an SP-4 lattice structure and an important aspect of most DLC polish-stop layers is the incorporation of hydrogen into the DLC material, both of which act to restrict the layers of carbon atoms in the polish-stop layer from moving with respect to each other. DLC, in fact, is usually deposited by chemical vapor deposition or plasma enhanced chemical vapor deposition processes that use a carrier gas containing hydrogen that enhances the incorporation of hydrogen into the DLC material. As stated above, however, the present invention preferably deposits the graphitic carbon stratum by plasma vapor deposition from a carbon target. Thus, by providing a graphitic carbon stratum that is essentially free of carbon-hydrogen bonds and has an SP-3 lattice structure, the present invention uses a low friction layer instead of a hard layer to reduce the polishing rate with hard pads.

Another advantage of the present invention is that a low friction stratum made from graphitic carbon enhances the throughput of the CMP process because only a thin layer of graphitic carbon is required to provide an effective polish-stop layer. Unlike DLC, a graphitic carbon stratum with a thickness of only 100 Å provides an effective polish-stop layer for both hard and soft polishing pads. The throughput of the CMP process is accordingly enhanced because it takes less time to deposit and clean a thin stratum of graphitic carbon than a thicker layer of DLC.

Still another advantage of the present invention is that the graphitic carbon stratum may be deposited on the wafer at a low temperature that does not damage or alter other electrical components. Many electrical components of integrated circuits are formed in silicon, which anneals at approximately 450° C. A low friction stratum 180 made from graphitic carbon is preferably deposited at a temperature of between approximately 50° C. and 150° C. Therefore, the deposition temperature of a low friction stratum 180 made from graphitic carbon does not damage or alter the other electrical components on the wafer.

An additional advantage of the present invention is that it enhances the throughput of the CMP process because a low friction stratum 180 made from graphitic carbon effectively stops further planarization even when higher down forces are used to increase the polishing rate. Higher down forces on the order of 7–9 psi generally reduce the effectiveness of polish-stop layers. In the case of a low friction stratum 180 made from graphitic carbon, however, the above-listed tests were performed with a down force of approximately 7.0–7.5 psi. Therefore, CMP processes that use higher down forces to achieve higher polishing rates may be effectively end-pointed with a low friction stratum 180 made from graphitic carbon.

Figure 5A:
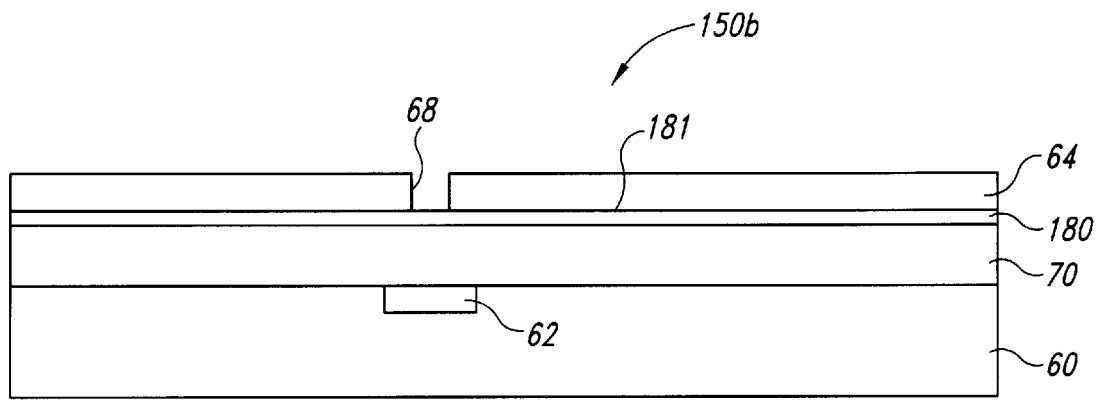
FIG. 5A is a partial schematic cross-sectional view of a step in a method for making a wafer in accordance with the invention.
Figure 5B:
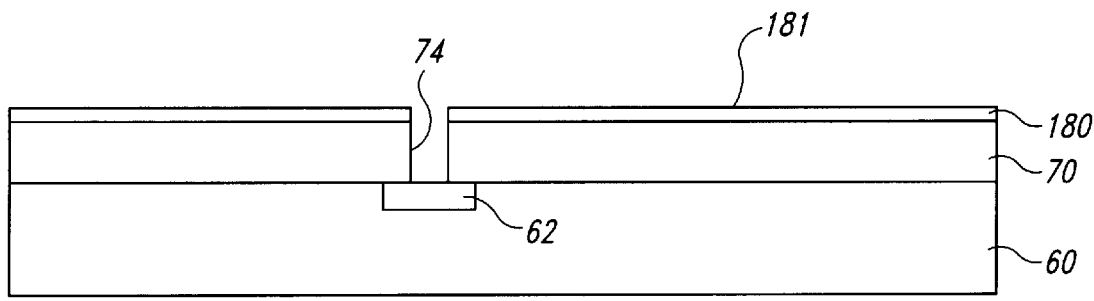
FIG. 5B is a partial schematic cross-sectional view of another step in a method for making a wafer in accordance with the invention.
Figure 5C:
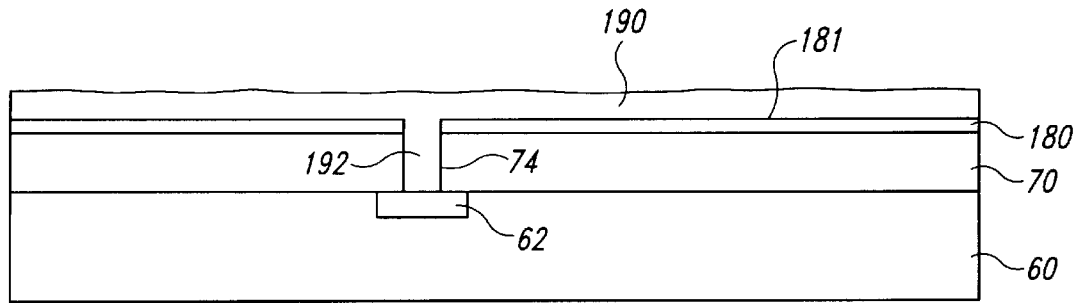
FIG. 5C is a partial schematic cross-sectional view of another step in a method for making a wafer in accordance with the invention.
Figure 5D:
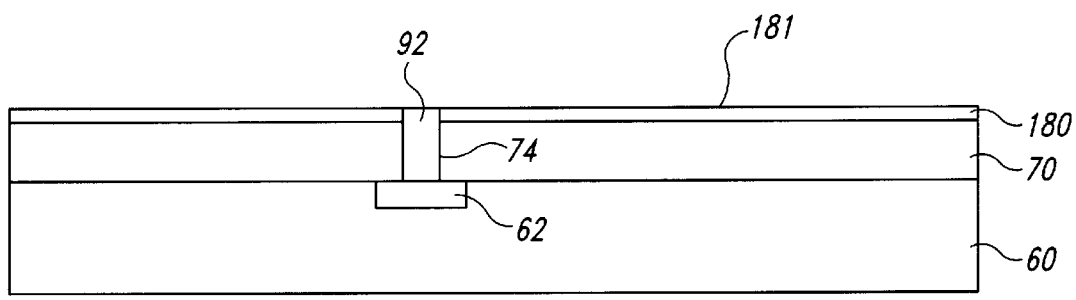
FIG. 5D is a partial schematic cross-sectional view of another step in a method for making a wafer in accordance with the invention.

FIGS. 5A–5D illustrate a process for making an interconnect wafer 150(b) in accordance with the invention. Referring to FIG. 5A, the insulative layer 70 is deposited over the substrate 60 and the device feature 62. The low friction stratum 180 is deposited on the insulative layer 70, and a resist layer 64 is deposited on the low friction stratum 180 so that a hole 68 in the resist 64 is positioned over the device feature 62. Referring to FIG. 5B, a via 74 is cut through the graphitic stratum 180 and etched through the insulative layer 70. After the via 74 is formed, the resist layer 64 is removed from the polish-stop surface 181 of the low friction stratum 180. Referring to FIG. 5C, an upper layer 190 of conductive material is deposited over the low friction stratum 180 and into the via 74. The portion of the upper layer 190 in the via 74 forms an interconnect 192 coupled to the device feature 62. FIG. 5D illustrates the interconnect wafer 150(b) after the upper layer 190 has been planarized with a CMP process. As discussed above with respect to FIGS. 3 and 4, the polish-stop surface 181 of the low friction stratum 180 effectively stops further planarization even when hard polishing pads, aggressive slurries, and high down forces are used in the CMP process.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A semiconductor wafer for use in a chemical-mechanical planarization process, comprising:

a substrate having a device feature formed on the substrate;

a graphitic carbon stratum positioned over the substrate, the stratum having a polish-stop surface positioned at a level substantially proximate to a desired end-point of the chemical-mechanical planarization process, and the stratum having a thickness between approximately 100 Å and 600 Å; and an upper layer deposited on the stratum, the upper layer having a higher polishing rate than that of the stratum, wherein the stratum substantially resists chemical-mechanical planarization with a polishing pad in a slurry to substantially stop the planarization process at the desired end-point.

2. The wafer of claim 1, further comprising:

an insulative layer between the stratum and the substrate; and a via through the stratum and the insulative layer, wherein the upper layer is made from a conductive material to form an interconnect in the via.

3. The wafer of claim 1 wherein the stratum has a thickness between approximately 300 Å and 500 Å.

4. The wafer of claim 2 wherein the device feature is coupled to the interconnect.

5. The wafer of claim 2 wherein the insulative layer comprises silicon dioxide.

6. The wafer of claim 2 wherein the insulative layer comprises borophosphate silicon glass.

7. The wafer of claim 3 wherein the stratum is approximately 100 Å to 500 Å thick.

8. The wafer of claim 3 wherein the interconnect comprises tungsten.

9. The wafer of claim 3 wherein the interconnect comprises aluminum.

10. The wafer of claim 3 wherein the interconnect comprises polysilicon.

11. Tile wafer of claim 1, further comprising a device feature under the stratum, and wherein the upper layer is made from an insulative material.

12. A microelectronic-device substrate assembly, comprising:

a substrate member;

a graphitic carbon stratum over at least a portion of the substrate, the graphitic carbon stratum having, a thickness between approximately 100 Å and 600 Å and a first polishing rate in planarization; and an upper layer over the graphitic carbon stratum, the upper layer having a second polishing rate less than the first polishing rate of the graphitic carbon stratum.

13. The substrate assembly of claim 12, further comprising:

an insulative layer between the graphitic stratum and the substrate; and a via through the graphitic carbon stratum and the insulative layer, wherein the upper layer comprises a conductive material to form an interconnect in the via.

14. The substrate assembly of claim 12 wherein the graphitic carbon stratum has a thickness between approximately 100 Å and 500 Å.

15. The substrate assembly of claim 12 further comprising a device feature formed on the substrate, and wherein the substrate assembly further comprises:

an insulative layer between the graphitic stratum and the substrate; and a via through the graphitic carbon stratum and the insulative layer, the via being positioned over the device feature, and wherein the upper layer comprises a conductive material to form an interconnect in the via coupled to the device feature.

16. The substrate assembly of claim 15 wherein the insulative layer comprises silicon dioxide.

17. The substrate assembly of claim 15 wherein the insulative layer comprises borophosphate silicon glass.

18. The substrate assembly of claim 12 wherein the graphitic carbon stratum is approximately 100 Å and 300 Å thick.

19. The substrate assembly of claim 12 further comprising a device feature formed on the substrate, and wherein the substrate assembly further comprises:

an insulative layer between the graphitic stratum and the substrate; and a via through the graphitic carbon stratum and the insulative layer, the via being positioned over the device feature, and wherein the upper layer comprises tungsten to form a tungsten interconnect in the via coupled to the device feature.

20. The substrate assembly of claim 12 further comprising a device feature formed on the substrate, and wherein the substrate assembly further comprises:

an insulative layer between the graphitic stratum and the substrate; and a via through the graphitic carbon stratum and the insulative layer, the via being positioned over the device feature, and wherein the upper layer comprises aluminum to form an aluminum interconnect in the via coupled to the device feature.

21. The substrate assembly of claim 12 further comprising a device feature formed on the substrate, and wherein the substrate assembly further comprises:

an insulative layer between the graphitic stratum and the substrate; and a via through the graphitic carbon stratum and the insulative layer, the via being positioned over the device feature, and wherein the upper layer comprises polysilicon to form a polysilicon interconnect in the via coupled to the device feature.

* * * * *